(12) United States Patent
Okumura et al.

(10) Patent No.: US 11,335,561 B2
(45) Date of Patent: May 17, 2022

(54) APPARATUS FOR LASER IRRADIATION AND METHOD FOR LASER IRRADIATION

(71) Applicant: Samsung Display Co., Ltd., Yongin-si (KR)

(72) Inventors: Hiroshi Okumura, Hwaseong-si (KR); Jong Jun Baek, Seoul (KR); Byung Soo So, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 41 days.

(21) Appl. No.: 16/907,029

(22) Filed: Jun. 19, 2020

(65) Prior Publication Data

US 2021/0143015 A1 May 13, 2021

(30) Foreign Application Priority Data

Nov. 11, 2019 (KR) .......................... 10-2019-0143312

(51) Int. Cl.
*H01L 21/20* (2006.01)
*H01L 21/268* (2006.01)
*H01L 21/02* (2006.01)
*B23K 26/06* (2014.01)

(52) U.S. Cl.
CPC ........ *H01L 21/268* (2013.01); *B23K 26/0648* (2013.01); *H01L 21/02691* (2013.01); *H01L 21/02675* (2013.01)

(58) Field of Classification Search
CPC ............ H01L 21/02691; H01L 21/268; B23K 26/0648; G03F 7/70091; G03F 7/70108; G03F 7/702; G03F 7/70191

USPC ........................................................ 438/487
See application file for complete search history.

(56) References Cited

U.S. PATENT DOCUMENTS

| | | | |
|---|---|---|---|
| 5,858,807 A | 1/1999 | Kawamura | |
| 7,679,800 B2 | 3/2010 | Yamazaki | |
| 2004/0059444 A1* | 3/2004 | Tsukakoshi | G03F 7/70258 700/59 |
| 2008/0204682 A1* | 8/2008 | Uehara | G03F 7/70258 355/46 |
| 2017/0229307 A1* | 8/2017 | Kido | B23K 26/066 |
| 2020/0185222 A1 | 6/2020 | Okumura et al. | |

FOREIGN PATENT DOCUMENTS

| | | |
|---|---|---|
| JP | H09-260684 A | 10/1997 |
| KR | 10-2009-0119818 A | 11/2009 |
| KR | 10-2010-0093560 A | 8/2010 |
| KR | 10-1135535 B1 | 4/2012 |
| KR | 10-2015-0007140 A | 1/2015 |
| KR | 10-1810062 B1 | 12/2017 |
| KR | 10-2018-0102721 A | 9/2018 |
| KR | 10-2020-0068812 A | 6/2020 |

* cited by examiner

*Primary Examiner* — Brook Kebede
(74) *Attorney, Agent, or Firm* — Lewis Roca Rothgerber Christie LLP

(57) ABSTRACT

A laser irradiation apparatus includes: a laser module configured to emit a laser beam; a first optical system configured to scan the laser beam emitted from the laser module along a first direction; an optical element configured to refract the laser beam emitted from the first optical system; and a substrate supporter on which a base substrate to which the laser beam refracted through the optical element reaches is arranged.

19 Claims, 15 Drawing Sheets

APPARATUS FOR LASER IRRADIATION AND METHOD FOR LASER IRRADIATION

CROSS-REFERENCE TO RELATED APPLICATION

The present application claims priority to and the benefit of Korean Patent Application No. 10-2019-0143312 filed on Nov. 11, 2019 in the Korean Intellectual Property Office, the disclosure of which is incorporated herein by reference in its entirety.

BACKGROUND

1. Field

Aspects of some example embodiments of the present disclosure relate to a laser irradiation apparatus and a method for laser irradiation.

2. Description of the Related Art

A pixel driving circuit of a display device may include a thin film transistor using silicon. Amorphous silicon or polycrystalline silicon may be used as the silicon constituting the thin film transistor.

Because a semiconductor active layer forming a source, a drain, and a channel may be amorphous silicon, an amorphous silicon thin film transistor (amorphous silicon TFT: a-Si TFT) used in a pixel driving circuit may have a relatively low electron mobility of 1 $cm^2/Vs$ or less. Accordingly, the amorphous silicon thin film transistor may be replaced with a polycrystalline silicon thin film transistor (polycrystalline silicon TFT: poly-Si TFT). Polycrystalline silicon thin film transistor may have a relatively greater electron mobility and relatively superior stability to light irradiation than amorphous silicon thin film transistor. Accordingly, polycrystalline silicon thin film transistors may be suitable for use as an active layer of a driving thin film transistor or a switching thin film transistor of a display device.

The polycrystalline silicon may be manufactured by various methods, wherein the methods may be may include a method of directly depositing the polycrystalline silicon, and a method of depositing the amorphous silicon and then crystallizing the amorphous silicon. In the method of depositing the amorphous silicon and then crystallizing the amorphous silicon, an amorphous silicon thin film may be crystallized by a laser beam irradiation method, a heating method, or the like. A laser irradiation apparatus may change a laser beam to surface light using an optical module and then proceed with crystallization by irradiating the amorphous silicon thin film of a base substrate with the surface light.

The above information disclosed in this Background section is only for enhancement of understanding of the background and therefore the information discussed in this Background section does not necessarily constitute prior art.

SUMMARY

When a laser beam has an abnormality or defect such as lens contamination, cracks, or the like of a laser irradiation apparatus, a crystallization abnormality portion or area having different grain sizes according to a laser scan may appear, for example, in the form of streaks or lines. The crystallization abnormality portion may be recognized or perceived by users in the final manufactured product in the form of streaks or lines in a display device.

Aspects of some example embodiments of the present disclosure are directed to providing a laser irradiation apparatus and a method of irradiating laser for manufacturing a display device having a relatively uniform quality.

According to some example embodiments, a laser irradiation apparatus includes a laser module configured to emit a laser beam; a first optical system configured to scan the laser beam emitted from the laser module along one direction; an optical element configured to refract the laser beam emitted from the first optical system; and a substrate supporter on which a base substrate to which the laser beam refracted through the optical element reaches is arranged.

According to some example embodiments, a method of irradiating laser includes emitting, by a laser module, a laser beam to transmit the laser beam to a first optical system; and scanning the laser beam received by the first optical system from one side to the other side of a base substrate, wherein the laser beam is emitted from the first optical system and then passes through an optical element before reaching the base substrate.

Aspects of some example embodiments of the present disclosure are not limited to the above-described characteristics, and other characteristics which are not mentioned may be more clearly understood by those skilled in the art from the specification and the accompanying drawings.

According to some example embodiments of the present disclosure, a laser irradiation apparatus and a method of irradiating a laser for providing a relatively uniform crystallization quality can be provided.

Characteristics of example embodiments of the present disclosure are not limited to the above, and further various characteristics are included in the specification.

BRIEF DESCRIPTION OF THE DRAWINGS

The above and other aspects and features of example embodiments according to the present disclosure will become more apparent by describing certain characteristics thereof in more detail with reference to the attached drawings, in which.

DETAILED DESCRIPTION

Aspects of some example embodiments of the present invention will now be described more fully hereinafter with reference to the accompanying drawings, in which aspects of some example embodiments of the invention are shown. This invention may, however, be embodied in different forms and should not be construed as limited to the example embodiments set forth herein. Rather, these embodiments are provided so that this disclosure will be more thorough and more complete, and will more-fully convey the scope of embodiments according to the present invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Figure 1:
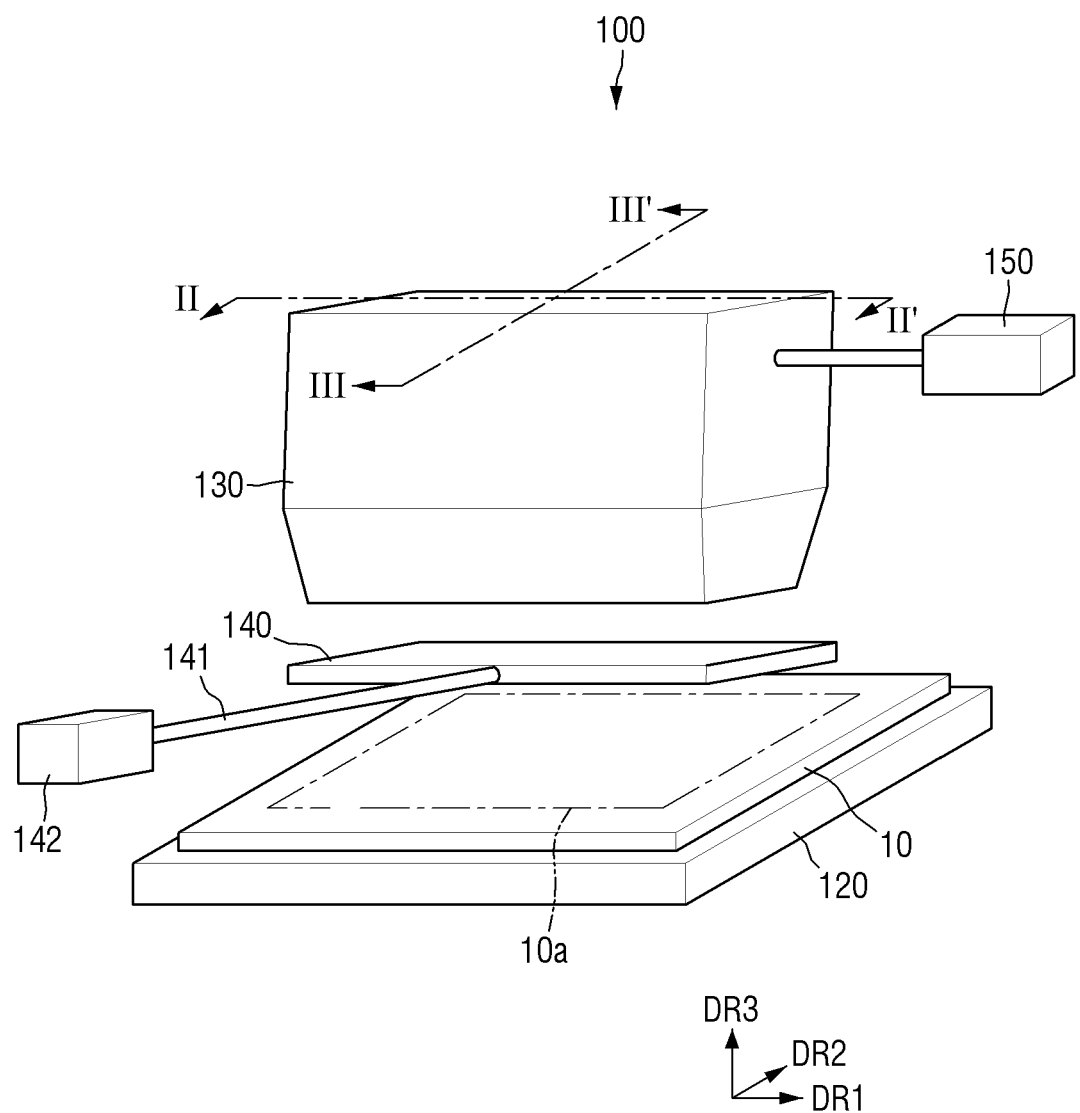
FIG. 1 is a configuration diagram illustrating a laser irradiation apparatus according to some example embodiments.
Figure 2:
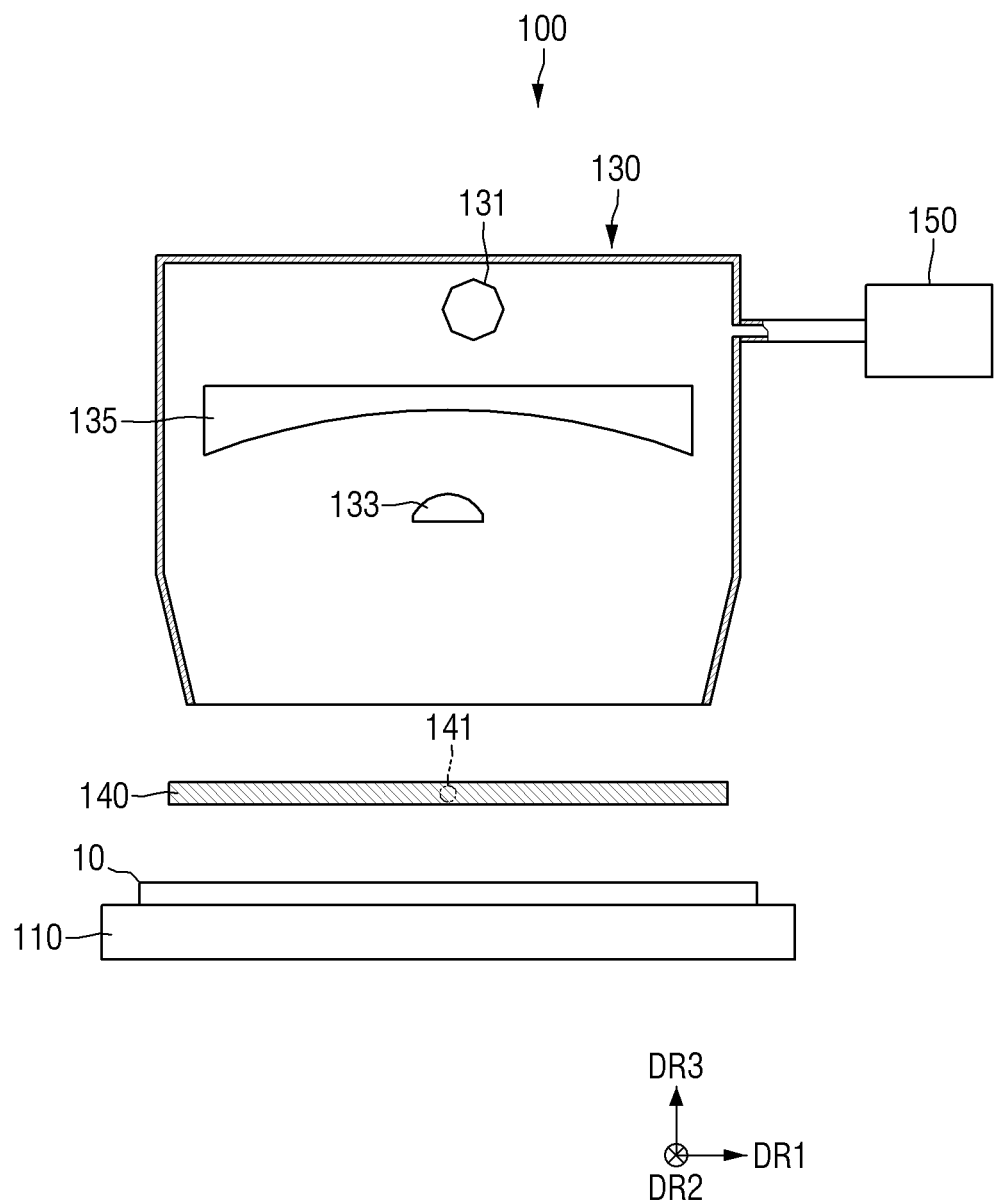
FIG. 2 is a cross-sectional view of the laser irradiation apparatus taken along the line II-II' in FIG. 1.
Figure 3:
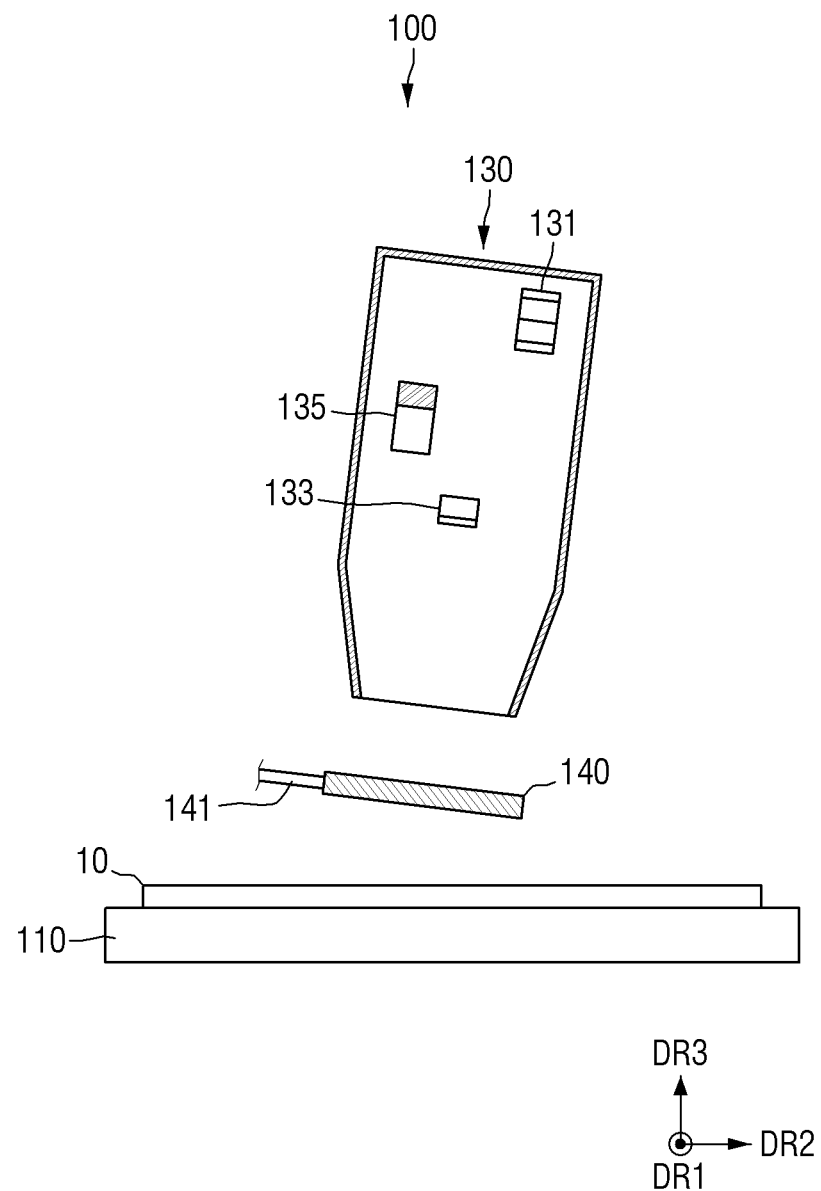
FIG. 3 is a cross-sectional view of the laser irradiation apparatus taken along the line III-III' in FIG. 1.
Figure 4:
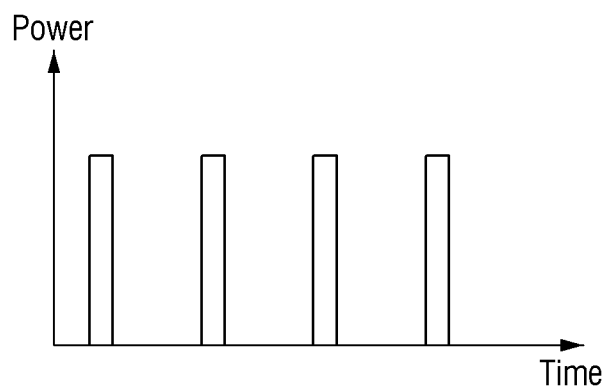
FIG. 4 is a waveform view of a laser beam emitted from a laser module.

FIG. 1 is a configuration diagram illustrating a laser irradiation apparatus according to some example embodiments. FIG. 2 is a cross-sectional view of the laser irradiation apparatus taken along the line II-II' in FIG. 1. FIG. 3 is a cross-sectional view of the laser irradiation apparatus taken along the line III-III' in FIG. 1. FIG. 4 is a waveform view of a laser beam emitted from a laser module.

Referring to FIGS. 1 to 4, a laser irradiation apparatus 100 according to some example embodiments may be capable of irradiating an amorphous thin film on a base substrate 10 with a laser to crystallize the thin film. Hereinafter, as an example of the thin film crystallization, although an example in which the amorphous silicon thin film deposited on the base substrate 10 is crystallized to a crystalline silicon thin film is illustrated, embodiments according to the present disclosure are not limited thereto.

The base substrate 10 may constitute, for example, a flat substrate applied to a display device or the like. An organic light emitting display device, a micro LED display device, a nano LED display device, a quantum dot light emitting display device, a liquid crystal display device, a plasma display device, a field emission display device, an electrophoretic display device, an electrowetting display device, or the like may be an example of the display device, but embodiments are not limited thereto.

The base substrate 10 may be a glass substrate or a flexible substrate. The flexible substrate may be one of a polyethylene terephthalate (PET) film, a polypropylene (PP) film, a polyethylene (PE) film, a polyimide (PI) film, a polystyrene (PS) film, a polycarbonate (PC) film, a polyethylene naphthalate (PEN) film, a cyclic olefin copolymer (COC) film, or an acrylic film.

At least one or more element areas 10a may be formed in an upper surface of the base substrate 10. An amorphous silicon thin film may be deposited on the element area 10a. The element area 10a may be formed by being divided into sub-element areas which are smaller areas.

In the element area 10a, various elements necessary to operate a flat display device may be implemented after the amorphous silicon thin film is crystallized. Meanwhile, the amorphous silicon thin film deposited on the base substrate 10 may not be divided by the element area 10a and may be entirely formed as the element area 10a. The base substrate 10 and the various elements formed in the element area 10a may form a flat substrate of the display device.

Hereinafter, configurations of the laser irradiation apparatus 100 will be described in more detail.

The laser irradiation apparatus 100 according to some example embodiments may include a substrate supporter 120, a first optical system 130, an optical element 140, and a laser module 150.

The laser irradiation apparatus 100 may further include a process chamber in which the inside is hollow and a heat treatment atmosphere and/or a vacuum atmosphere may be formed. The process chamber may be a space in which a laser irradiation process proceeds.

The substrate supporter 120, the first optical system 130, and the optical element 140 may be located in the process chamber. The laser module 150 connected to the first optical system 130 may be located at the outside of the process chamber. The process chamber may be formed in a rectangular parallelepiped shape but embodiments are not limited thereto, and the process chamber may have various shapes. The process chamber may be coupled to a heater to form the heat treatment atmosphere, and may be coupled to a vacuum module to form the vacuum atmosphere.

The base substrate 10 to be subjected to laser irradiation may be seated on the substrate supporter 120. The substrate supporter 120 may be a supporter which supports the base substrate 10 on which a silicon thin film is formed. The substrate supporter 120 may have an area greater than that of the base substrate 10. An edge of the base substrate 10 may be located in an area within the substrate supporter 120. The base substrate 10 may generally occupy a center of the substrate supporter 120. The substrate supporter 120 may have a substantially rectangular parallelepiped shape but embodiments are not limited thereto, and the substrate supporter 120 may have a cubic shape, a polygonal pillar, a cylindrical shape, or the like.

The substrate supporter 120 may be moved by a separate transporting unit. For example, the substrate supporter 120 may be moved by a roller, but embodiments are not limited thereto. The substrate supporter 120 may fix the base substrate 10 seated on the upper surface thereof using a chucking unit. The chucking unit may fix the base substrate 10 using vacuum, static electricity and/or a van der Waals force.

The first optical system 130 may be an apparatus which scans a laser beam emitted from the laser module 150 which will be described later in a telecentric manner. For example, the first optical system 130 may be connected to the laser module 150, and may scan the laser beam transmitted from the laser module 150 on an upper surface or lower surface of the base substrate 10 to form scan lines SL. The scan lines SL may refer to lines formed in the upper surface of the base substrate 10 when the first optical system 130 overlappingly scans the laser beam from one side to the other side of the base substrate 10.

The first optical system 130 may be rotatably configured, and may include a polygon mirror 131 having a shape of a polygonal pillar, a convex mirror 133 spaced from the other side of the polygon mirror 131 in a second direction DR2 and the other side of the polygon mirror 131 in a third direction DR3, and a concave mirror 135 spaced from one side of the convex mirror 133 in the third direction DR3. Hereinafter, as an example of the first optical system 130, the first optical system 130 including the polygon mirror 131, the convex mirror 133, and the concave mirror 135 is illustrated, but embodiments are not limited thereto. For example, the first optical system 130 may include a galvano mirror and an f-theta lens. Here, the galvano mirror may replace the polygon mirror 131, and the f-theta lens may replace the convex mirror 133 and the concave mirror 135.

According to some example embodiments, although the polygon mirror 131 having a shape of an octagonal pillar is shown in FIG. 2, embodiments according to the present disclosure are not limited thereto, and the polygon mirror 131 may be configured in another polygonal shape such as a nonagonal pillar, a decagonal pillar, or the like. The polygon mirror 131 may be configured to be connected to an external driving source to be rotatable.

The convex mirror 133 may be arranged so that a convex mirror surface thereof faces one side in the third direction DR3, and a flat surface thereof faces the other side in the third direction DR3. The concave mirror 135 may be arranged so that a concave mirror surface thereof faces the other side in the third direction DR3, and a flat surface thereof faces one side in the third direction DR3. The concave mirror 135 may have a larger width in the first direction DR1 in comparison with the convex mirror 133. The positional relation between the polygon mirror 131, the convex mirror 133, and the concave mirror 135 is not limited to the above, and the polygon mirror 131, the convex mirror 133, and the concave mirror 135 may have other positional relations as long as a moving path the same as a moving path of the laser beam which will described in more detail below is shown.

The laser beam emitted to the first optical system 130 may be irradiated onto the polygon mirror 131. The laser beam irradiated onto the polygon mirror 131 may be reflected by the polygon mirror 131 and then irradiated onto the convex mirror 133. The laser beam irradiated onto the convex mirror 133 may be reflected by the convex mirror 133 and then be irradiated onto the concave mirror 135. The laser beam irradiated onto the concave mirror 135 may be reflected by the concave mirror 135 and then irradiated onto the base substrate 10.

When the laser beam is irradiated onto the first optical system 130, the polygon mirror 131 may rotate. When the polygon mirror 131 rotates, the laser beam may scan an upper surface of the convex mirror 133 from one side to the other side in the first direction DR1. The laser beam reflected by the convex mirror 133 may scan a lower surface of the concave mirror 135 from one side to the other side in the first direction DR1. The laser beam reflected by the concave mirror 135 may scan the upper surface of the base substrate 10 from one side to the other side in the first direction DR1.

The first optical system 130 may be located to be spaced from one side of the base substrate 10 seated on the substrate supporter 120 in the third direction DR3, but may be arranged at the other side of the base substrate 10 in the third direction DR3 according to a structure of the substrate supporter 120. The first optical system 130 may overlap the substrate supporter 120 in the third direction DR3. The other side surface of the first optical system 130 in the third direction DR3 may be formed to be open, but embodiments are not limited thereto, and the first optical system 130 may be composed of a flat plate formed of a transparent material having little effect on the laser beam.

As described above, because the first optical system 130 scans the laser beam in an entire area of the scan line SL in a telecentric manner, laser spots 20 (shown, e.g., in FIG. 6) forming the scan lines SL may be uniformly formed. That is, the shape and size of the laser spot 20 may be uniformly formed regardless of a position in the scan line SL.

In the laser irradiation apparatus 100 according to some example embodiments, the laser beam may be scanned while the base substrate 10 is moving along the second direction DR2 and the first optical system 130 is in a state of being fixed, but embodiments according to the present disclosure are not limited thereto, and the laser beam may be scanned while the first optical system 130 moving along the second direction DR2 and the base substrate 10 is in a state of being fixed.

The scan lines SL may be formed by a method in which the first optical system 130 scans the laser beam to one side to the other side of the base substrate 10 in the first direction DR1, and then repeats the laser beam scanning from one side to the other side of the base substrate 10 in the first direction DR1 again after the base substrate 10 moves a distance (e.g., a set or predetermined distance) to one side in the second direction DR2.

The first optical system 130 may not move along the first direction DR1 in which the scan line SL is formed. Accordingly, the scan line SL may be formed as a uniform straight line along the first direction DR1. That is, the laser spots 20 forming the scan line SL may have a uniform overlapping area with adjacent laser spots 20 such that the distance or separation between portions (e.g., center portions) of the adjacent laser spots 20 is uniform or relatively uniform across the scan line SL. Accordingly, a heating temperature of the thin film may be relatively uniformly maintained. That is, in the laser irradiation apparatus 100, because the first optical system 130 does not have to be moved in the first direction DR1, the linearity of the scan line SL and the uniformity of the heating temperature according thereto may be increased in an entire area of the base substrate 10.

The first optical system 130 may appropriately adjust a scanning speed and a spot interval according to a diameter of the laser spot 20 to adjust a heating temperature of the amorphous silicon thin film. For example, the first optical system 130 may increase an overlapping area between two laser spots 20 adjacent to each other in the scan lines SL by lowering a scanning speed to increase the heating temperature of the amorphous silicon thin film.

When the laser beam irradiated from the first optical system 130 toward the base substrate 10 is perpendicular to the base substrate 10, the first optical system 130 may be damaged by the laser beam reflected to the base substrate 10. Accordingly, the first optical system 130 may irradiate a laser beam tilted by a predetermined angle with respect to an axis in the third direction DR3. To this end, the first optical system 130 itself may be tilted with respect to the axis in the third direction DR3, but is not limited thereto, and may be parallel to the axis in the third direction DR3 and only the laser beam may be tilted.

The optical element 140 may be arranged between the first optical system 130 and the base substrate 10. The optical element 140 may be a flat plate through which the laser beam emitted from the first optical system 130 is transmitted and refracted before reaching the base substrate 10. The optical element 140 may be arranged to be spaced from the other side of the first optical system 130 in the third direction DR3, and from one side of the base substrate 10 in the third direction DR3. The optical element 140 may overlap the first optical system 130 in the third direction DR3, and may also overlap the substrate supporter 120 in the third direction DR3.

The optical element 140 in a horizontal state without being tilted may be substantially parallel to the substrate supporter 120, and may be perpendicular to the laser beam. The optical element 140 may be coupled to a rotary shaft 141 perpendicular to the laser beam. The rotary shaft 141 may be coupled to a center portion of a side surface of the optical element 140.

The optical element 140 may rotate and be tilted by the rotary shaft 141 coupled thereto. A tilt angle which is an angle difference between the horizontal optical element 140 and the tilted optical element 140 and indicates a tilt degree of the optical element 140 may be changed by the rotation of the rotary shaft 141. According to some example embodiments, the rotary shaft 141 may be coupled to a rotation module 142 to change the tilt angle of the optical element 140 through the rotation module 142.

For example, the tilt angle may be changed in a manner in which the optical element 140 is tilted at an angle (e.g., a set or predetermined angle) in one direction from the horizontal state and then returns to the horizontal state, and is tilted at an angle the same as the above-described angle in the other direction and then returns to the horizontal state through the rotation of the rotary shaft 141.

The optical element 140 may be formed of a material having a refractive index (n) in a range of 1.3 to 2.0 and capable of transmitting the laser beam therethrough. That is, the refractive index of the optical element 140 may be 1.3 to 2.0. When the refractive index (n) is smaller than 1.3, a refraction effect may be small, and when the refractive index (n) is greater than 2.0, the transmittance of the laser beam having a wavelength of 350 nm or less may be low. According to some example embodiments, the optical element 140 may be formed of one material selected from among magnesium fluoride, calcium fluoride, yttrium aluminum garnet, quartz, sapphire, and the like, of a combination thereof. The refractive index of the magnesium fluoride may be roughly 1.39, the refractive index of the calcium fluoride may be roughly 1.40, the refractive index of the yttrium aluminum garnet may be roughly 1.82, the refractive index of the quartz may be roughly 1.54, and the refractive index of the sapphire may be roughly 1.76.

If a rotating mirror reflecting the laser beam is used instead of the optical element 140, the angle of the scan line SL of the laser beam may vary according to the changing angle of the rotating mirror and may not be parallel to each other. On the other hand, the laser irradiation apparatus 100 according to some example embodiments may use the optical element 140 that transmits the laser beam. The tilt angle of the optical device 140 may be changed by the rotation axis of the rotation shaft 141 parallel to the substrate support 120 and perpendicular to the scan line SL. Therefore, the parallelism of the scan line SL may be maintained regardless of the tilt angle of the optical element 140.

The laser beam which may be irradiated onto the base substrate 10 may be emitted from the laser module 150. The laser module 150 may be located at the outside of the process chamber, and may be connected to the first optical system 130.

The laser module 150 may include a fiber laser which emits a laser beam of an infrared band, a visible light band, or an ultraviolet band. The laser module 150 may include an output fiber which transmits a laser beam to the outside. Because the laser module 150 is connected to the first optical system 130 through the output fiber and transmits the laser beam, loss of the laser beam may be minimized during a transmission process. The fiber laser may include a laser diode from which light pumping proceeds and a fiber Bragg grating which acts as a laser oscillator. The fiber laser may irradiate or emit the laser beam of the infrared band, the visible light band, or the ultraviolet band. The fiber laser may emit a laser beam of a green color band in the case of the visible light band. The fiber laser may, according to some example embodiments, emit and irradiate a laser beam having a wavelength of 532 nm. Further, the fiber laser may emit and irradiate a laser beam of the ultraviolet band. The fiber laser may emit a laser beam of a suitable wavelength band according to the crystallization temperature and crystallization time of the thin film.

The fiber laser may be set to have an appropriate frequency by adjusting an irradiation time and a pause time of the laser beam. For example, the laser beam of the fiber laser may be irradiated as a laser beam having a frequency of 10 to 200 MHz. Here, the frequency of the laser beam may be the number of laser beams irradiated during a unit time. Further, the fiber laser may adjust the irradiation time and the pause time to a time unit of nsec to adjust the irradiated number of laser beams irradiated onto one laser spot 20 and an amount of applied energy. The laser beam of the fiber laser is a pulsed laser having a peak, but a laser beam having a quasi-continuous wave characteristic by adjusting the irradiation time and the pause time may be irradiated. Accordingly, the fiber laser may adjust a heating temperature of the thin film by adjusting the irradiated number of laser beams.

The fiber laser may be turned on and turned off for each laser spot 20, and may selectively irradiate the laser beam for each position. Accordingly, the fiber laser may perform selective heat treatment for each minute position of the thin film.

The fiber laser may heat the thin film to a temperature lower than a melting point of the thin film. According to some example embodiments, the fiber laser may heat the amorphous silicon thin film to a temperature lower than a melting point of the amorphous silicon thin film. When the crystalline silicon thin film is crystallized at a temperature lower than a melting point thereof, because abnormal protrusion formed at a crystal grain boundary is reduced, crystallinity may be improved. Because a melting temperature of the amorphous silicon thin film is roughly 1460° C., the fiber laser may be controlled to heat the amorphous silicon thin film to a temperature of 1300 to 1400° C.

Figure 5:
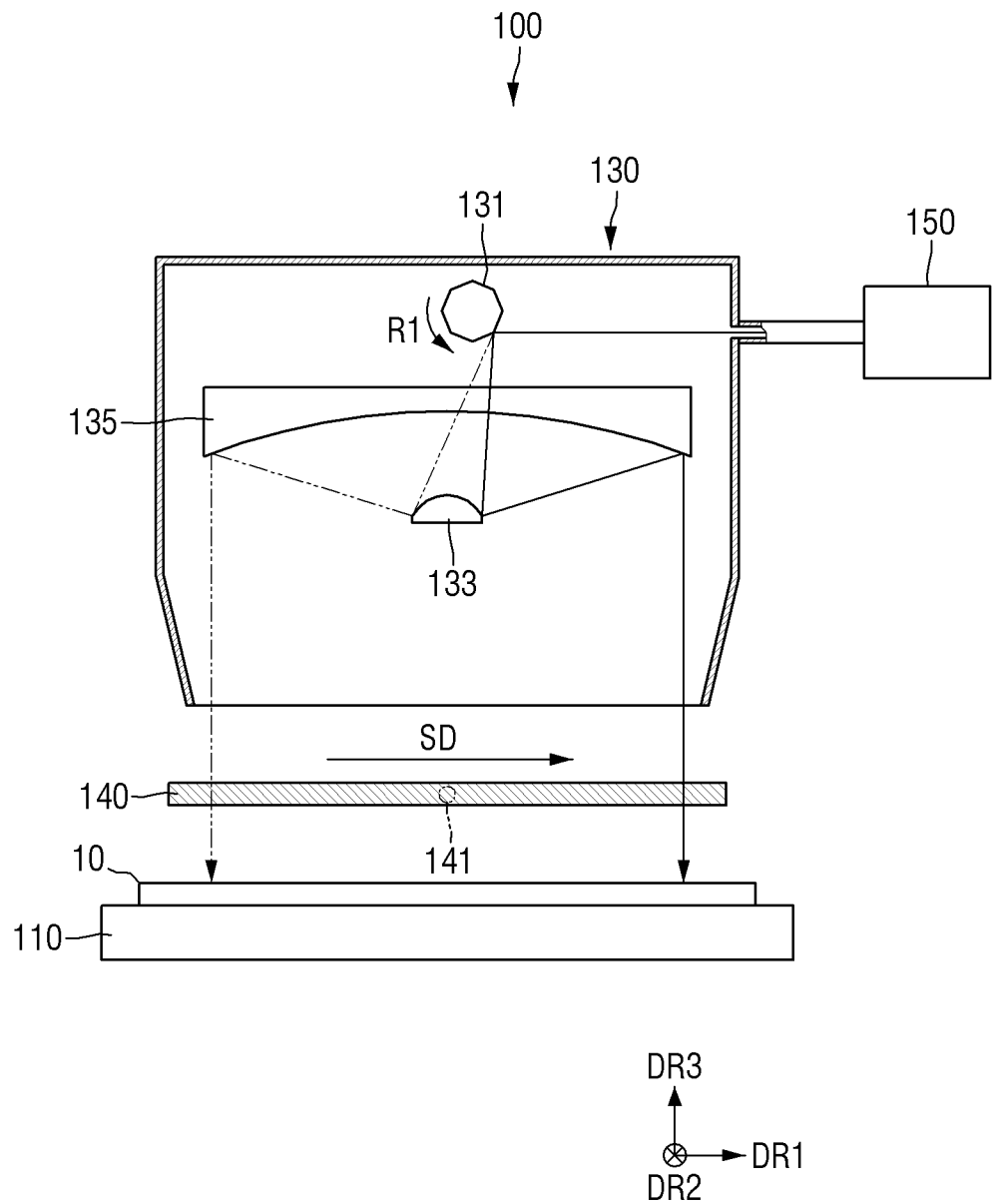
FIG. 5 is a schematic view for describing a laser irradiation process according to some example embodiments.
Figure 6:
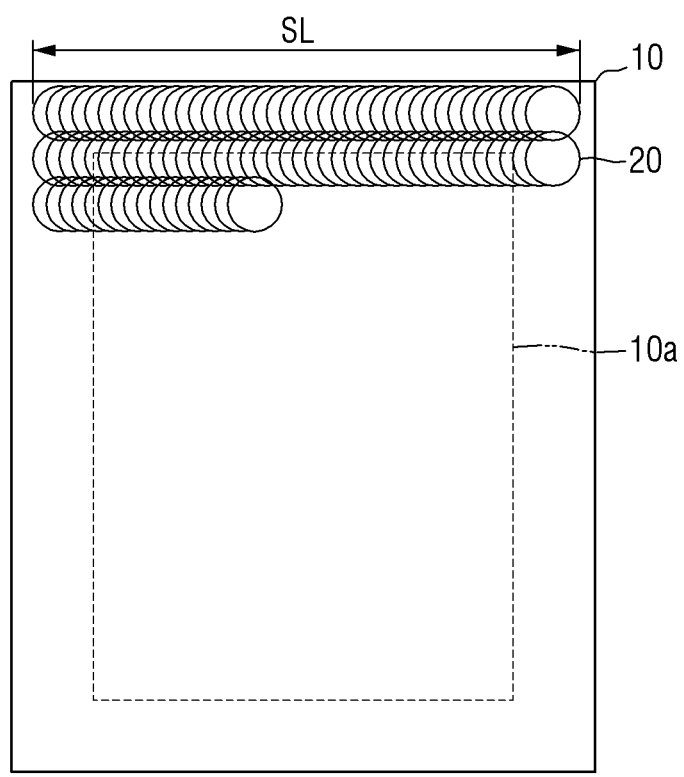
FIG. 6 is a plan view of a laser spot and a scan line in the laser irradiation process according to some example embodiments.

FIG. 5 is a schematic view for describing a laser irradiation process according to some example embodiments. FIG. 6 is a plan view of a laser spot and a scan line in the laser irradiation process according to some example embodiments.

With reference to FIGS. 5 and 6, the process of irradiating the amorphous silicon thin film with laser using the laser irradiation apparatus 100 will be described. The laser irradiation apparatus 100 may irradiate the base substrate 10 with the laser beam to crystallize the amorphous silicon thin film into a crystalline silicon thin film. The laser module 150 may emit a laser beam to the first optical system 130. As described above, the laser beam may be sequentially reflected by the polygon mirror 131, the convex mirror 133, and the concave mirror 135 to be irradiated onto the base substrate 10. When the laser beam is irradiated onto the first optical system 130, in the case of the polygon mirror 131 rotating R1, the laser beam may be scanned from one side to the other side of the first direction DR1, that is, in a scanning direction SD of the laser beam to form the scan line SL.

An overlapping area may be formed between the laser spots 20 adjacent to each other in one scan line SL. In the laser spot 20, the overlapping area and scanning speed may be changed according to the frequency of the laser beam and the crystallization temperature. When the crystallization temperature is relatively high, the scanning speed of the laser beam may be reduced so that the overlapping area between the laser spots 20 adjacent to each other increases. The amorphous silicon thin film may be heated to the crystallization temperature while increasing the irradiated number of laser beams at one spot. Meanwhile, when the frequency of the laser beam is high, even when the scanning speed of the laser beam increases and thus an overlapping area decreases, the amorphous silicon thin film may be heated to the crystallization temperature.

The first optical system 130 may be located at the outside of one side of the element area 10a in the second direction DR2 to irradiate the laser beam while forming the scan line SL. One side in the second direction DR2 of the scan line SL, which is formed first in the scan lines SL may not overlap the scan line SL formed later but an area overlapping the scan line SL formed later may occur in the other side of the scan line SL in the second direction DR2. Accordingly, because the scan line SL which is formed first among the scan lines SL may have a temperature difference between one side and the other side in the second direction DR2, the first optical system 130 may be located at the outside of one side of the element area 10a in the second direction DR2.

The first optical system 130 constituting the laser irradiation apparatus 100 according to one embodiment may scan the laser beam from one side to the other side of the element area 10a in the first direction DR1 to form the scan lines SL. After the scan lines SL are formed, the base substrate 10 may be moved (e.g., by a set or a predetermined distance) to one side in the second direction DR2. The first optical system 130 may scan the laser beam from one side to the other side in the first direction DR1 to form the scan lines SL. In this case, the laser beam may not be scanned on an area of the base substrate 10 except the element area 10a.

The laser spot 20 of the scan line SL may overlap the laser spot 20 of the scan line SL, which is formed previously. That is, the scan line SL may overlap the scan line SL, which is formed previously. However, because the irradiated number of laser beams on an area in which the laser spots 20 overlap each other along the second direction DR2 increases in comparison with that on a non-overlapping area, the heating temperature may increase.

Further, because the first optical system 130 scans the laser beam while uniformly forming the scan lines SL from one side to the other side of the element area 10a, one side of a previous scan line SL may have a relatively lowered temperature after a predetermined time has elapsed. Accordingly, an increase in temperature of an overlapping area between the laser spot 20 formed at one side of the scan line SL and the laser spot 20 formed in the scan line SL which is formed previously may not be large. Further, because a later laser beam is sequentially irradiated after the same time has elapsed as that for the previous laser spot 20, in the laser spot 20 formed while moving from one side from the other side in the scan line SL, a temperature increase may not be large in comparison with that of the laser spots 20 which are adjacent in the same scan line SL. Accordingly, even when the scan lines SL overlap each other, the temperature increase of an overlapping area may not be large. Further, a temperature increase difference in an overlapping area between the scan lines SL at one side and the other side of the scan line SL in the first direction DR1 may not be large.

On the other hand, when the scan line SL is formed from one side to the other side in the first direction DR1, and the next scan line SL is formed from the other side to one side in the first direction DR1, that is, when the scan line SL is formed in a zigzag shape, because the laser beam is overlappingly irradiated onto the laser spot 20 formed at the other side of the scan line SL at a relatively small time interval, the temperature increase may be large. Further, because the laser beam is overlappingly irradiated onto the laser spot 20 formed at one side of the scan line SL at a relatively long-time interval, the temperature increase may not be large. Accordingly, in the overlapping area between the scan lines SL, a difference between temperature increases of the overlapping areas at one side and the other side in the first direction DR1 may be large.

The first optical system 130 may form the scan line SL with a length greater than a width of the element area 10a formed in the base substrate 10. The first optical system 130 may irradiate the laser beam so that the laser spot 20 formed at one end of the scan line SL in the first direction DR1 may be formed at an outer side of one side of the element area 10a in the first direction DR1. According to some example embodiments, the first optical system 130 may allow a plurality of laser spots 20 formed at one end in the first direction DR1 to be formed at the outer side of one side of the element area 10a in the first direction DR1. Further, the first optical system 130 may irradiate the laser beam so that the laser spot 20 formed at the other end of the scan line SL in the first direction DR1 may be formed at an outer side of the other side of the element area 10a in the first direction DR1. According to some example embodiments, the first optical system 130 may allow a plurality of laser spots 20 formed at the other end in the first direction DR1 to be formed at the outer side of the other side of the element area 10a in the first direction DR1. The laser spots 20 formed at one end and the other end of the scan line SL in the first direction DR1 may be unstable in comparison with the laser spots 20 formed in a center area due to a difference in the irradiated number of laser beams or the like. Accordingly, the first optical system 130 may irradiate the laser beam so that the stable laser spots 20 in the scan lines SL except the laser spots 20 at one side and the other side in the first direction DR1 may be formed in the element area 10a.

Figure 7:
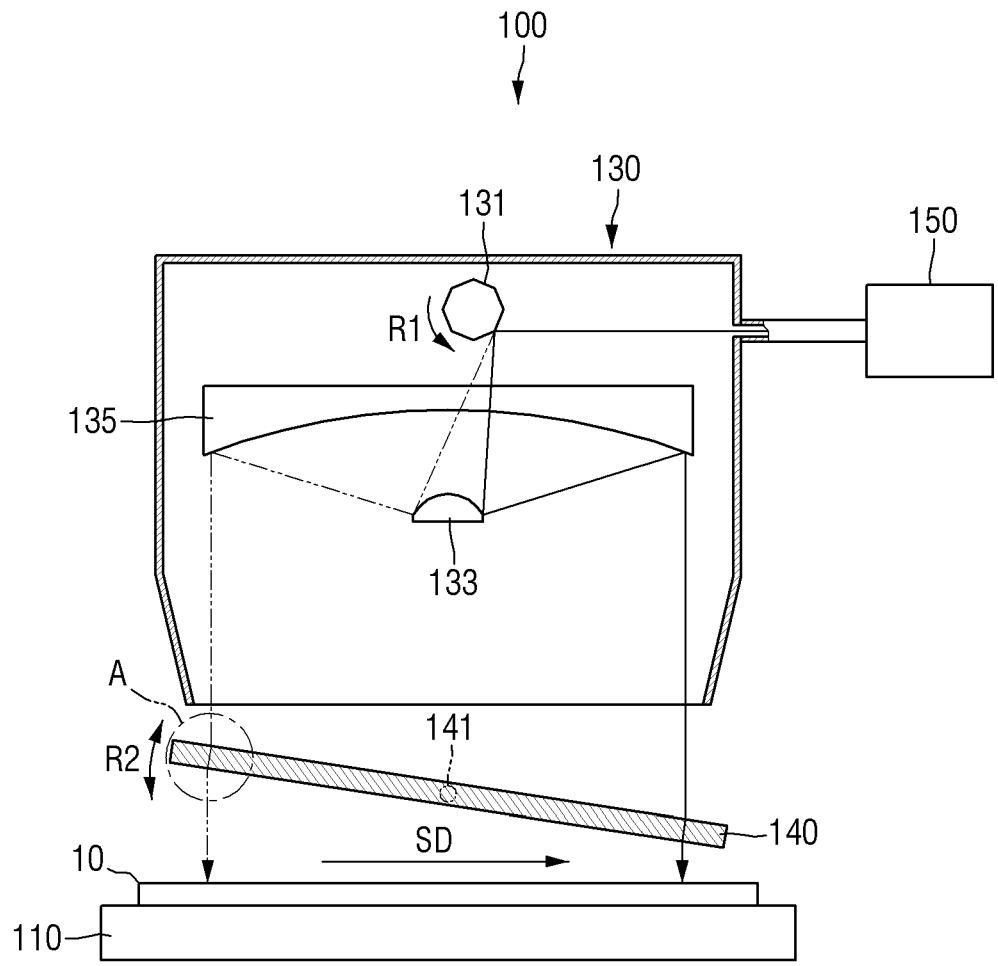
FIG. 7 is a schematic view illustrating a laser irradiation process performed when an optical element is tilted.
Figure 8:
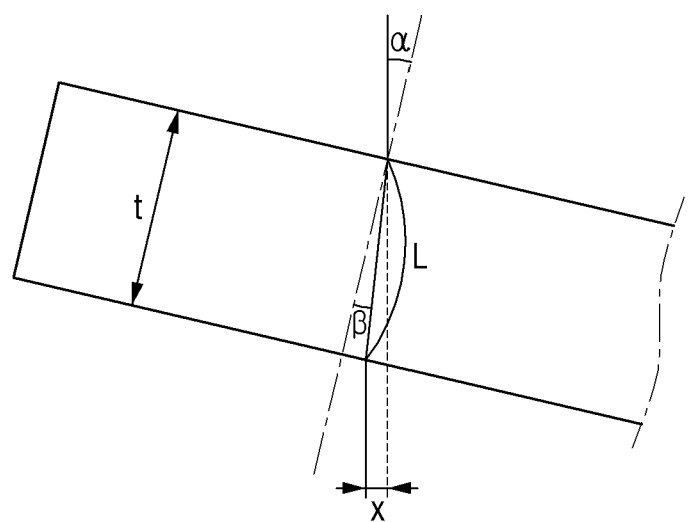
FIG. 8 is an enlarged cross-sectional view of the area A shown in FIG. 7.
Figure 9:
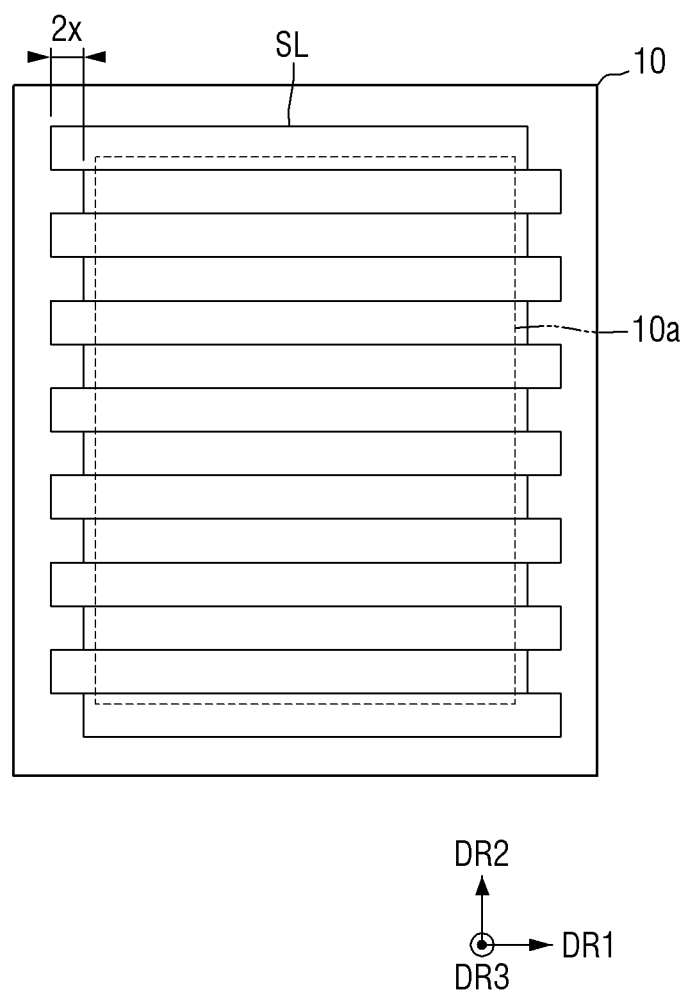
FIG. 9 is a plan view illustrating the scan line formed by the laser beam in the laser irradiation process.

FIG. 7 is a schematic view illustrating a laser irradiation process performed when an optical element is tilted. FIG. 8 is an enlarged cross-sectional view of the area A shown in FIG. 7. FIG. 9 is a plan view illustrating the scan line formed by the laser beam in the laser irradiation process.

With reference to FIGS. 7 to 9, the horizontal movement of the laser beam in the first direction DR1 when the tilt angle of the optical element 140 is changed will be described. As described above with reference to FIG. 5, the laser module 150 may emit the laser beam to the first optical system 130, and the laser beam may be sequentially reflected by the polygon mirror 131, the convex mirror 133, and the concave mirror 135 to be irradiated onto the base substrate 10. Meanwhile, in an embodiment in which the first optical system 130 includes a galvano mirror and an f-theta lens, the laser beam may be irradiated onto the base substrate 10 via the galvano mirror and the f-theta lens in order.

When the laser beam is emitted to the first optical system 130, in the case of the polygon mirror 131 rotating R1, the laser beam may be scanned from one side to the other side of the first direction DR1, that is, in the scanning direction SD of the laser beam to form the scan lines SL.

In this case, when the optical element 140 rotates R2 and thus the tilt angle is changed, the laser beam may be refracted by the optical element 140 which is tilted by rotating R2. When the laser beam is refracted, the laser spots 20 may horizontally move in the first direction DR1. Accordingly, the scan lines SL formed of the laser spots 20 may also horizontally move in the first direction DR1. A horizontal movement direction of the scan lines SL may be the same as or opposite the scanning direction SD. Hereinafter, the horizontal movement of the scan lines SL due to refraction of the laser beam will be specifically described with reference to FIG. 8 which is an enlarged view of the area A shown in FIG. 7.

When a laser beam which travels to the optical element 140 whose refractive index is (n) and thickness is t has an incident angle of α° and a refractive angle of β°, the refractive index (n) may be represented by $$n = \frac{\sin(\alpha)}{\sin(\beta)}.$$

A length (L) of a traveling path of the laser beam in the optical element 140 may be represented by $$L = \frac{t}{\cos(\beta)}.$$

A horizontal movement distance (x) of the laser beam in the first direction DR1 may be represented by x=L×sin(α−β). Accordingly, because the angle β° may be represented by $$\beta = \arcsin\left(\frac{\sin(\alpha)}{n}\right),$$

the horizontal movement distance (x) of the laser spot 20 formed by the laser beam which travels to the optical element 140 whose refractive index is (n) and thickness is t at the incident angle of α° may be represented by $$x = \frac{t}{\cos\left(\arcsin\left(\frac{\sin(\alpha)}{n}\right)\right)} \times \sin\left(\alpha - \arcsin\left(\frac{\sin(\alpha)}{n}\right)\right).$$

Thus, according to some example embodiments, the laser beam may pass through the optical element 140 and be irradiated onto the base substrate 10. When the optical element 140 is tilted, the laser beam is refracted, and thus the laser spot 20 may horizontally move a length or distance (e.g., a set or predetermined length) in the first direction DR1 on the base substrate 10 in comparison with a case in which the optical element 140 is horizontal. Accordingly, the scan line SL may horizontally move a length or distance (e.g., a set or predetermined length) in the first direction DR1 relative to the scan line SL which is adjacent thereto and thus an alignment error may occur. The horizontal movement distance (x) may be changed according to the refractive index (n) and the thickness t of the optical element 140 and the incident angle, and the magnitude thereof depends on the above-described equation for the horizontal movement distance (x).

When a case in which one scan line SL is formed and then the tilt angle of the optical element 140 is changed before the next scan line SL is formed is repeated, the scan line SL may be shown as in FIG. 9. When it is assumed that one scan line SL of the scan lines SL shown in FIG. 9 is a scan line SL formed when the horizontal optical element 140 is tilted α° in one direction, the scan line SL adjacent to the above-described scan line SL in the second direction DR2 may be a scan line SL formed when the horizontal optical element 140 is tilted α° in a direction opposite the one direction. Accordingly, an alignment error in the first direction DR1 between the scan lines SL adjacent to each other formed in FIG. 9 may be twice the horizontal movement distance (x) shown in FIG. 8.

Even when the tilt angle of the optical element 140 changes when the scan line SL is formed, the parallelism of the scan line SL may be maintained. As described above, because the tilt angle of the optical element 140 is changed by the rotation axis of the rotation shaft 141 parallel to the substrate support 120 and perpendicular to the scan line SL, the parallelism of the scan line SL can be maintained.

Figure 10:
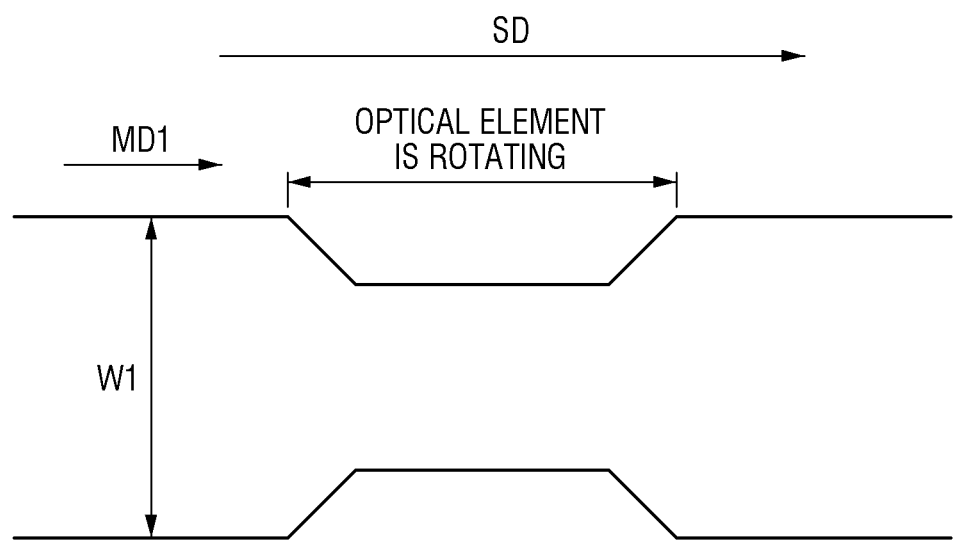
FIG. 10 is a schematic view illustrating a change of a crystallization width shown in the case in which a scanning direction and a horizontal movement direction are the same when a tilt angle of the optical element is changed during the laser beam scanning in the laser irradiation process.
Figure 11:
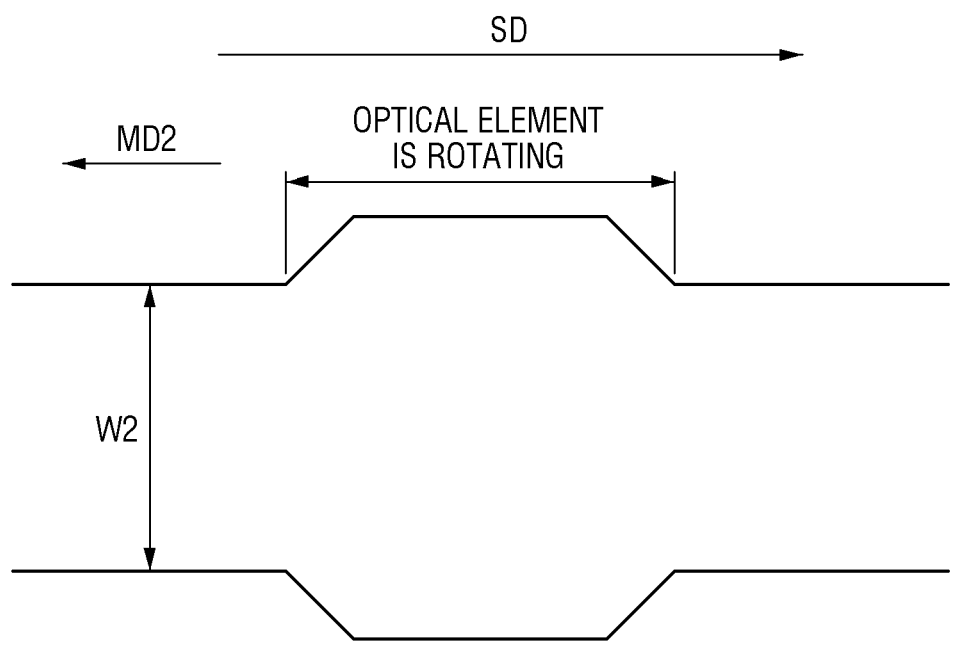
FIG. 11 is a schematic view illustrating a change of a crystallization width shown in the case in which the scanning direction and the horizontal movement direction are opposite when the tilt angle of the optical element is changed during the laser beam scanning in the laser irradiation process.

FIG. 10 is a schematic view illustrating a change of a crystallization width shown in the case in which a scanning direction and a horizontal movement direction are the same when a tilt angle of the optical element is changed during the laser beam scanning in the laser irradiation process. FIG. 11 is a schematic view illustrating a change of a crystallization width shown in the case in which the scanning direction and the horizontal movement direction are opposite when the tilt angle of the optical element is changed during the laser beam scanning in the laser irradiation process.

Referring to FIGS. 10 and 11, when more laser beam is irradiated onto the amorphous silicon thin film, more crystallization may occur in the silicon thin film at the corresponding portion, and a width of a crystallized area may increase.

In the laser irradiation apparatus 100 according to some example embodiments, the tilt angle of the optical element 140 may be changed during the laser beam scanning. When the tilt angle of the optical element 140 is changed during the laser beam scanning, in the case in which the scanning direction SD and a horizontal movement direction MD1 of the laser beam are the same, a scanning speed may relatively increase due to refraction of the laser beam which occurs while the laser beam passes through the optical element 140. A case in which the scanning speed of the laser beam is fast may refer to a case in which an irradiation time of the laser beam to a specific area of the amorphous silicon thin film is small and thus an irradiation amount of the laser beam is small. Accordingly, when the tilt angle of the optical element 140 is changed so that the laser beam horizontally moves in a direction the same as the scanning direction SD, a width W1 of an area crystallized while the tilt angle of the optical element 140 is changed may decrease in comparison with a case in which the tilt angle of the optical element 140 is not changed.

When the tilt angle of the optical element 140 is changed during the laser beam scanning, in the case in which the scanning direction SD and the horizontal movement direction MD1 of the laser beam are opposite, a scanning speed may be relatively slow due to the refraction of the laser beam which occurs while the laser beam passes through the optical element 140. A case in which the scanning speed of the laser beam is slow may refer to a case in which the irradiation time of the laser beam to the specific area of the amorphous silicon thin film is large and thus the irradiation amount of the laser beam is large. Accordingly, when the tilt angle of the optical element 140 is changed so that the laser beam horizontally moves in a direction opposite the scanning direction SD, a width W2 of the area crystallized while the tilt angle of the optical element 140 is changed may increase in comparison with the case in which the tilt angle of the optical element 140 is not changed.

Figure 12:
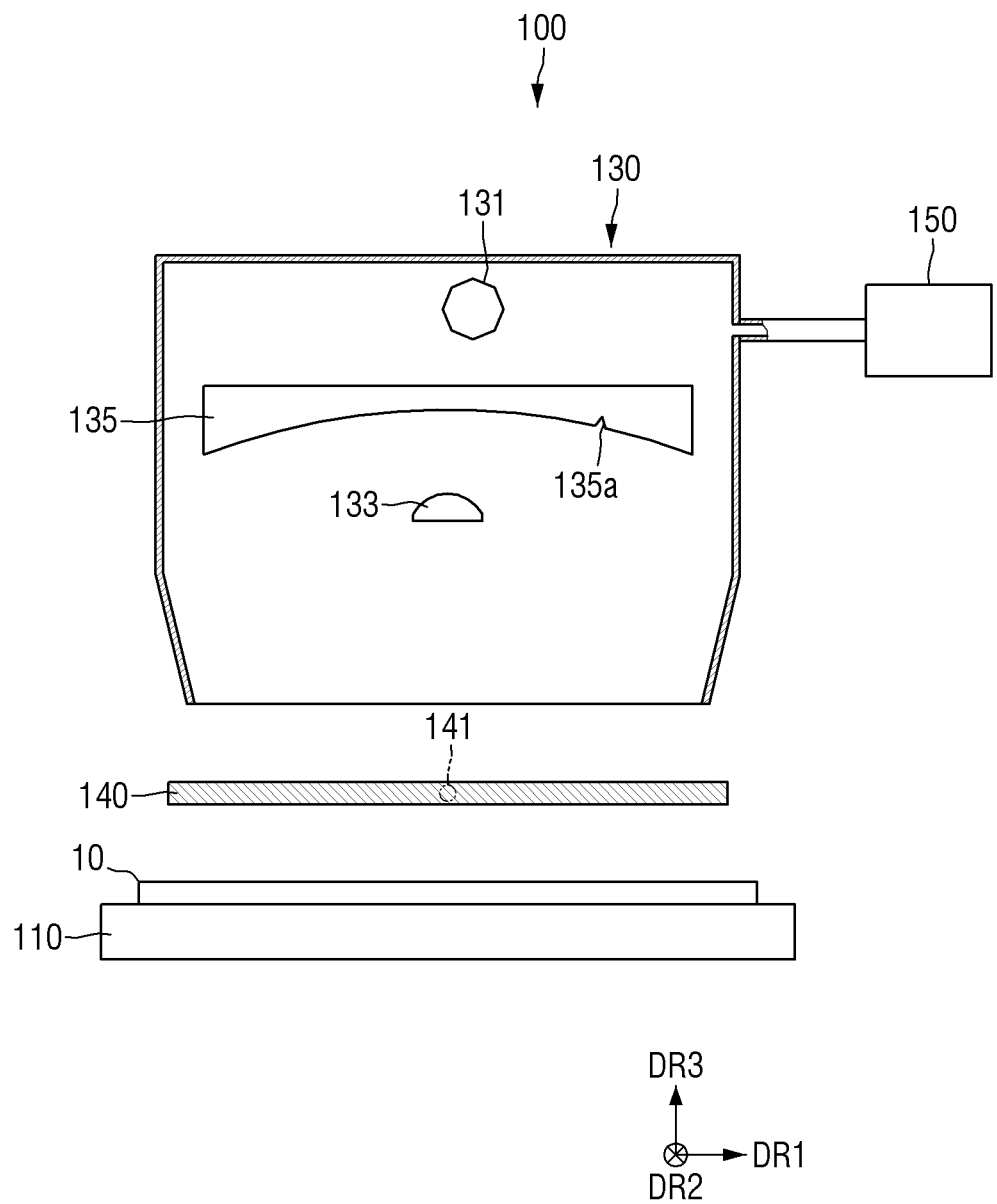
FIG. 12 is a schematic view illustrating a laser irradiation apparatus in which a crack is present.
Figure 13:
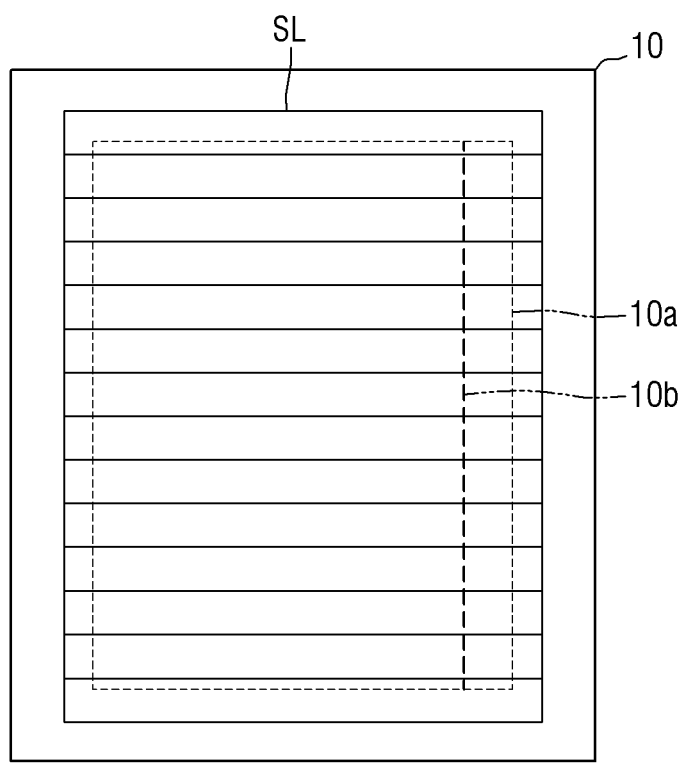
FIG. 13 is a plan view illustrating a base substrate shown when the tilt angle of the optical element is not changed in the laser irradiation apparatus according to FIG. 12.
Figure 14:
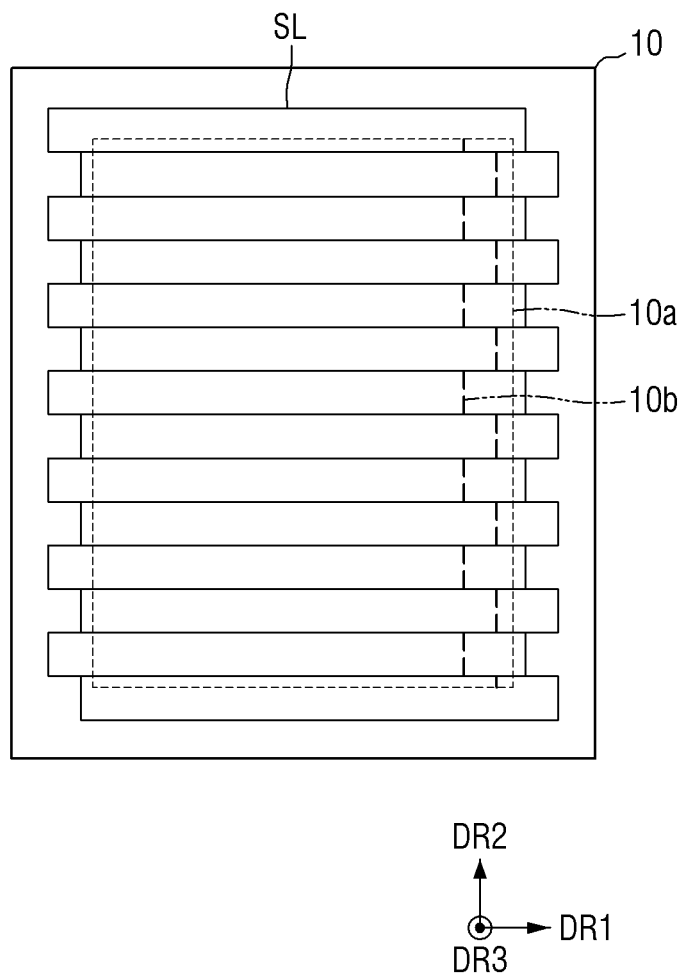
FIG. 14 is a plan view illustrating a base substrate shown when the tilt angle of the optical element is changed in the laser irradiation apparatus according to FIG. 12.

FIG. 12 is a schematic view illustrating a laser irradiation apparatus in which a crack is present. FIG. 13 is a plan view illustrating a base substrate shown when the tilt angle of the optical element is not changed in the laser irradiation apparatus according to FIG. 12. FIG. 14 is a plan view illustrating a base substrate shown when the tilt angle of the optical element is changed in the laser irradiation apparatus according to FIG. 12.

Referring to FIGS. 12 to 14, when a problem such as lens contamination, a crack 135*a*, or the like occurs in the laser irradiation apparatus 100, because an irradiation location of the laser beam is changed, a display abnormality portion 10*b* in the form of streaks may appear in the display device. FIG. 12 illustrates that the crack 135*a* occurs in the concave mirror 135, but embodiments according to the present disclosure are not limited thereto, and a crack may occur in the polygon mirror 131, the convex mirror 133, and/or the optical element 140.

If the tilt angle of the optical element 140 is not changed and the optical element 140 maintains a horizontal state, as shown in FIG. 13, the crystallization abnormality portions 10*b* may appear in the form of streaks. The crystallization abnormality portions 10*b* may occur when a crystallization degree is different in comparison with the surroundings. The crystallization abnormality portions 10*b* may be visually recognized in the form of streaks in a finally manufactured device. To solve or reduce this problem, some example embodiments include a method of scattering the crystallization abnormality portions 10*b* by slightly changing a laser irradiation position through the optical device 140.

In the laser irradiation apparatus 100 according to some example embodiments, the tilt angle of the optical element 140 may be changed after the laser beam scanning and before the next scan is performed. When the tilt angle of the optical element 140 is changed between scanning and the next scanning of the laser beam, as shown in FIG. 14, the crystallization abnormality portions 10*b* may be scattered along the scan lines SL. Accordingly, because the visual recognition of the crystallization abnormality portions 10*b* in the form of streaks in the finally manufactured device may be minimized or reduced, a display device having a relatively uniform quality may be provided.

The scan lines SL on the base substrate 10 may be scattered along the first direction DR1, and the widths W1 and W2 of the crystallized area may be scattered along the second direction DR2. Accordingly, when the tilt angle of the optical element 140 is changed between scanning and the next scanning of the laser beam, the display abnormality portion may be minimized or reduced even when the lens contamination, the crack, or the like in the laser irradiation apparatus 100 is present, and the display device having a relatively uniform quality may be provided.

Figure 15:
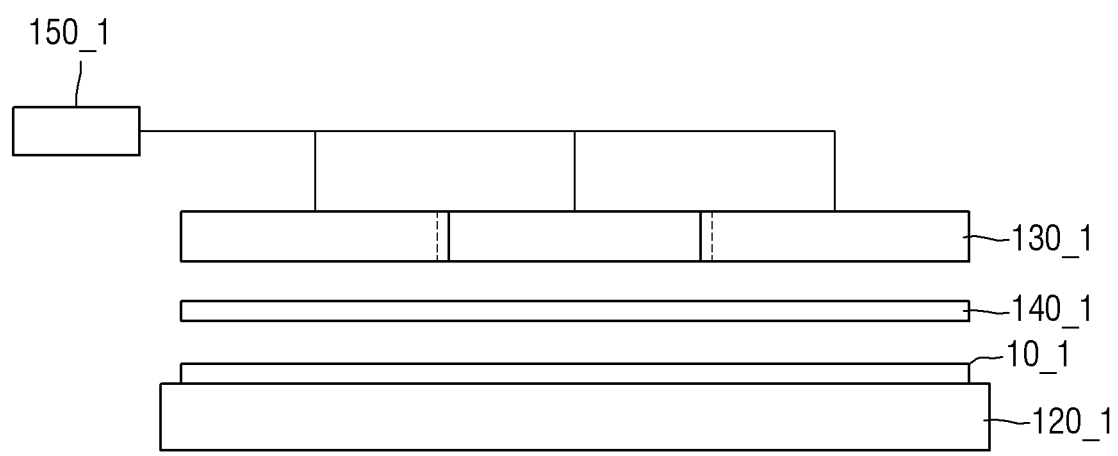
FIG. 15 is a schematic view illustrating a laser irradiation apparatus according to some example embodiments.

FIG. 15 is a schematic view illustrating a laser irradiation apparatus according to some example embodiments.

A laser irradiation apparatus 100_1 according to some example embodiments, as illustrated in FIG. 15, may be different from the laser irradiation apparatus 100 according to the embodiments described with respect to FIG. 1 in that a plurality of first optical systems 130_1 are included. The plurality of first optical systems 130_1 may be installed or arranged to be adjacent to each other. One optical element 140_1 may be installed or arranged between the first optical systems 130_1 and a base substrate 10_1, but embodiments according to the present disclosure are not limited thereto, and a plurality of optical elements 140_1 may be installed between the first optical systems 130_1 and the base substrate 10_1. Different laser modules 150_1 may be respectively connected to the first optical systems 130_1. Accordingly, in the laser irradiation apparatus 100_1, because the first optical systems 130_1 and the laser modules 150_1 are set with different conditions, an amorphous silicon thin film may be crystallized under different conditions.

When a problem such as lens contamination, a crack, or the like is present in the laser irradiation apparatus 100_1, because an irradiation location of the laser beam may be changed, a display abnormality portion in the form of streaks may appear in a display device. In the laser irradiation apparatus 100_1 according to some example embodiments, a tilt angle of the optical element 140_1 may be changed during the laser beam scanning. In the case in which the tilt angle of the optical element 140_1 is changed during the laser beam scanning, laser spots 20 on a base substrate 10_1 may be quickly scattered along the first direction DR1, and widths W1 and W2 of a crystallized area may be quickly scattered along the second direction DR2. Accordingly, in the case in which the tilt angle of the optical element 140_1 is changed during the laser beam scanning, the display abnormality portion may be minimized or reduced even when the lens contamination, the crack, or the like in the laser irradiation apparatus 100_1, is present, and a display device having a relatively uniform quality may be provided.

Because other content is the same as or similar to the above with reference to FIGS. 1 to 3, some additional detailed descriptions thereof may be omitted.

Those skilled in the art will appreciate that many variations and modifications can be made to the example embodiments without substantially departing from the spirit and scope of embodiments according to the present invention. Therefore, the disclosed example embodiments of the invention are used in a generic and descriptive sense only and not for purposes of limitation. Rather, embodiments according to the present disclosure are defined according to the appended claims and their equivalents.

What is claimed is:

1. A laser irradiation apparatus comprising:
a laser module configured to emit a laser beam;
a first optical system configured to scan the laser beam emitted from the laser module along a first direction;
an optical element configured to refract the laser beam emitted from the first optical system; and
a substrate supporter on which a base substrate to which the laser beam refracted through the optical element reaches is arranged,
wherein the first optical system includes a polygon mirror, a convex mirror, and a concave mirror.

2. The laser irradiation apparatus of claim 1, wherein the first optical system includes a galvano mirror and an f-theta lens.

3. The laser irradiation apparatus of claim 1, wherein the optical element is configured so that a tilt angle thereof is changed.

4. The laser irradiation apparatus of claim 3, wherein the tilt angle is configured to be changed after the laser beam is scanned on the base substrate and before a next scan is performed.

5. The laser irradiation apparatus of claim 1, wherein the laser module includes a fiber laser.

6. The laser irradiation apparatus of claim 1, wherein a refractive index of the optical element is 1.3 to 2.0.

7. The laser irradiation apparatus of claim 6, wherein the optical element comprises at least one of magnesium fluoride, calcium fluoride, yttrium aluminum garnet, quartz, or sapphire.

8. The laser irradiation apparatus of claim 1, wherein a silicon thin film is deposited on the base substrate.

9. The laser irradiation apparatus of claim 1, wherein the substrate supporter is configured to be movable in a direction perpendicular to a scanning direction of the laser beam.

10. The laser irradiation apparatus of claim 1, wherein:
the first optical system is plural in number in a scanning direction of the laser beam;
the first optical system is alternately arranged in a front-rear direction with the first optical system which is adjacent thereto so that there is no area on which the laser beam is not scanned in the scanning direction of the laser beam.

11. A method of irradiating laser, comprising:
emitting, by a laser module, a laser beam to transmit the laser beam to a first optical system; and
scanning the laser beam received by the first optical system from a first side to a second side opposite the first side of a base substrate,
wherein the laser beam is emitted from the first optical system and then passes through an optical element before reaching the base substrate,
wherein the first optical system includes a polygon mirror, a convex mirror, and a concave mirror.

12. The method of claim 11, further comprising changing a tilt angle of the optical element.

13. The method of claim 12, further comprising changing the tilt angle of the optical element after the laser beam is scanned on the base substrate and before a next scan is performed.

14. The method of claim 12, further comprising changing the tilt angle while the laser beam is scanned on the base substrate.

15. The method of claim 11, wherein a refractive index of the optical element is 1.3 to 2.0.

16. The method of claim 15, wherein the optical element comprises at least one of magnesium fluoride, calcium fluoride, yttrium aluminum garnet, quartz, or sapphire.

17. The method of claim 11, wherein:
further comprising sequentially passing the laser beam through the polygon mirror, the convex mirror, and the concave mirror.

18. The method of claim 11, wherein:
the first optical system includes a galvano mirror, and an f-theta lens; and
wherein the method further comprises sequentially passing the laser beam through the galvano mirror, and the f-theta lens.

19. The method of claim 11, further comprising:
scanning the laser beam from the first side to the second side of the base substrate to form a scan line;
moving the base substrate a predetermined length in a direction perpendicular to the scan line; and
scanning the laser beam from the first side to the second side of the base substrate again.

* * * * *